United States Patent [19]

Van Loan et al.

[11] Patent Number: 5,633,598

[45] Date of Patent: May 27, 1997

[54] TRANSLATOR FIXTURE WITH MODULE FOR EXPANDING TEST POINTS

[75] Inventors: David R. Van Loan, Diamond Bar; Mark A. Swart, Upland, both of Calif.

[73] Assignee: Everett Charles Technologies, Inc., Pomona, Calif.

[21] Appl. No.: 593,177

[22] Filed: Feb. 1, 1996

Related U.S. Application Data

[63] Continuation of Ser. No. 417,441, Apr. 5, 1995, abandoned, which is a continuation of Ser. No. 200,783, Feb. 23, 1994, abandoned, which is a continuation-in-part of Ser. No. 81,681, Jun. 23, 1993, abandoned.

[51] Int. Cl.$^6$ .................................................. G01R 31/28
[52] U.S. Cl. ............................................. 324/761; 324/754
[58] Field of Search ........................... 324/754, 758, 324/761, 757, 72.5; 439/482, 824

[56] References Cited

U.S. PATENT DOCUMENTS

| | | | |
|---|---|---|---|
| 4,352,061 | 9/1982 | Matrone | 324/754 |
| 4,724,383 | 2/1988 | Hart | 324/754 |
| 4,833,402 | 5/1989 | Boega-Peterson | 324/754 |
| 4,977,370 | 12/1990 | Andrews | 324/761 |
| 5,134,363 | 7/1992 | Dahlke | 324/761 |
| 5,204,615 | 4/1993 | Richards | 324/757 |
| 5,216,358 | 6/1993 | Vaucher | 324/754 |
| 5,304,921 | 4/1994 | Cook et al. | 324/758 |
| 5,389,885 | 2/1995 | Swart | 324/754 |

*Primary Examiner*—Vinh P. Nguyen
*Attorney, Agent, or Firm*—Christie, Parker & Hale, LLP

[57] ABSTRACT

A translator fixture for a grid-type test fixture for testing circuit boards. In regions of the circuit board where test point density exceeds the grid spacing of probes in a grid base the test points are reached by a test module that plugs into the translator fixture and includes a grid pattern of feed-through probes for contacting special tilt pins connected to certain test points in the high density region of the board. Additional test probes, located between the rows and columns of feed-through probes, support special tilt pins for translating the remaining test points in the high density region of the board to contacts on flex circuit-type cables sandwiched on the module and extending to the periphery of the fixture for coupling to contacts on the grid base to communicate with test circuits in the test analyzer. In an alternate embodiment, a translator module providing an interface between the bottom of the translator fixture and the grid base includes a translator board overlying the grid base and translating test signals from a high density set of contacts on one side of the board to a standard pattern of contacts on the other side aligned with the test probes on the grid base. A receiver plate overlying the translator board receives tilt pins with a high density spacing and provides compliant connections to the high density pattern of contacts on the translator board.

6 Claims, 11 Drawing Sheets

TRANSLATOR FIXTURE WITH MODULE FOR EXPANDING TEST POINTS

CROSS-REFERENCE TO RELATED APPLICATION

This is a continuation of application Ser. No. 08/417,441, filed Apr. 5, 1995, which is a continuation of application Ser. No 08/200,783, filed Feb. 23, 1994 now abandoned which is a continuation-in-part of application Ser. No. 08/081,681 filed Jun. 23, 1993 now abandoned.

FIELD OF THE INVENTION

This invention relates to the automatic testing of printed circuit boards, and more particularly, to grid fixtures of the type using a translator fixture for translating test points from an off-grid pattern on a board under test to a grid base having test probes on a standard grid pattern. The invention includes a high density translator module that cooperates with the translator fixture for testing high test point densities on the board under test, using the lower-density standard grid base.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so called "grid-type fixture" in which the test points on the board are contacted by translator pins which contact random patterns of test points on the board and transfer test signals to interface pins arranged in a grid pattern in a receiver. In these grid-type testers, fixturing is generally less complex and simpler than in the customized wired test fixtures; but with a grid system, the grid interfaces and test electronics are substantially more complex and costly. It is the grid-type testers to which the present invention is directed.

A typical grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate from a grid pattern of test probes in a grid base to an off-grid pattern of test points on the board under test. In one prior art grid fixture so-called "tilt pins" are used as the translator pins. The tilt pins are mounted in corresponding pre-drilled holes in translator plates which are part of the translator fixture. The tilt pins can tilt in various orientations to translate separate test signals from the off-grid random pattern of test points on the board to the grid pattern of test probes in the grid base. This grid pattern of test probes in the grid base communicates with the test electronics through the respective switches previously mentioned. In a typical grid-type test fixture the grid base may have its test probes arranged on 100 mil centers. The tilt pins used in the translator module make contact with a preselected number of test points on the board and then make contact with selected test probes in grid base, and as a result, a large number of switches which are connected to all of the probes in the grid base go unused during testing, which is a typical characteristic of grid-type test fixtures. Because the spacing density among test probes in the grid base is limited, test points on a board having a density greater than the typical 100 mil on-center grid base density, for example, cannot be easily tested on the standard 100 mil center grid-type fixture. For bare boards today which have closer and closer test point densities, it becomes extremely more difficult to test these boards on the standard grid-type test fixture.

One embodiment of the present invention provides a fixturing system for selectively modifying the test point density of a grid-type test fixture to provide accurate testing for greater test point densities than would otherwise be available with a standard translator fixture and the standard grid pattern. The invention includes an adapter that cooperates with the translator fixture to expand test point densities for boards or portions of boards having test points arranged in high density patterns, substantially higher than the density of the probes in the standard grid base. The adapter allows use of tilt pins to translate test signals from high density test points on the board under test to the lower density grid pattern of test points in the standard grid base.

SUMMARY OF THE INVENTION

Briefly, one embodiment of the invention provides improvements to a grid-type test fixture system for testing printed circuit boards. The system includes a grid base supporting test probes arranged on a grid pattern. The probes in the grid base are individually connected to corresponding electrical test circuits in an external automatic electronic test analyzer. A translator fixture is mounted on the grid pattern of probes in the grid base and supports the board under test. The translator fixture has vertically spaced-apart and parallel fixturing plates with holes drilled in patterns to support individual upright translator pins, such as tilt pins, for translating electrical connections between an off-grid pattern of test points on the board to the grid pattern of corresponding probes in the grid base. In certain regions of the board where the test point density exceeds the standard on-center spacing of the probes in the grid base, the test points are reached by a high density plug-in test module that locally expands the number of test points for a given area. The high density test module fits into a cutout space in a bottom plate of the translator fixture and includes a grid pattern of feed-through probes for contacting special tilt pins connected to certain test points in the high density region of the board. The feed-through probes in the module make normal spring contact with the grid pattern of probes in the grid base. The high density test module also includes an array of additional test probes located between the rows and columns of feed-through probes. The additional probes support further corresponding special tilt pins for completing contact with test points in the high density region of the board. The additional test probes make contact with electrical terminals of circuits contained on one or more flexible sheet-like flex cables carried on the high density translator module. The flex circuit cables extend to the periphery of the test fixture for coupling to the grid base and ultimately to the test circuit electronics in the electronic test analyzer. These connections are made without the need for increasing the number of electronically controlled test circuits in the tester.

This embodiment of the invention can be used with an otherwise standard grid-type tester to greatly increase the density of test points in selected regions of the board under test, over and above the test point density normally available from the on-grid pattern of probes on the standard grid base. This testing is accomplished with existing electronic circuitry normally available in the standard high speed electronic test analyzer.

In another form of the invention, a grid-type test fixture for testing a printed circuit board includes a grid base supporting spring-loaded test probes arranged in a grid pattern having a standard on-center spacing in which the probes in the grid base are individually connected to corresponding test circuits in an exterior automatic electronic test analyzer. A translator fixture for supporting the board under test is mounted between the grid base and the board. The translator fixture supports translator pins for translating electrical connections from an off-grid pattern of test points in the board to the grid pattern of spring probes in the grid base. The invention comprises a translator module for use in testing circuits on the board having test point densities greater than the standard on-center density of test probes in the grid base. The translator module includes a translator board having a first pattern of electrically isolated and electrically conductive contacts on a first side of the board communicating electrically with a second pattern of electrically isolated and electrically conductive contacts on a second side of the translator board. The spacing between contacts on the first side of the board is at a higher density than the spacing between contacts on the second side of the board. In use, the translator board is mounted over the grid base to align the contacts on the second side of the board with corresponding spring probes on the grid base. The translator module also includes a translator pin receiver plate mounted above the first surface of the translator board and below the translator fixture. The receiver plate has a first surface facing toward the translator fixture for containing a pattern of electrically isolated receiver holes on a pattern aligned with the higher density first pattern of contacts on the translator board. The receiver holes are adapted to receive the ends of separate translator pins supported by the translator fixture. Compliant electrical contact means within each receiver hole engage corresponding translator pins and produce compliant electrical contact between the translator pins and the higher density first pattern of electrical contacts on the translator board aligned with the corresponding receiver holes. When a compliant force is applied during testing, test signals are translated from the board under test through the translator pins to the compliant connections provided by the receiver plate and are then translated through the translator board to the test probes on the grid base.

This invention is particularly useful in testing small credit card sized circuit boards having test points on high density test patterns. The invention is carried out by mounting the translator module between the standard translator fixture and the standard grid base. The translator pins communicate with the high density test points on the board and the module then translates the test signals carried by its high density translator pins to the standard on-grid pattern of test probes on the grid base, while simultaneously providing the compliancy necessary for translating reliable test connections from the high density off-grid pattern to the lower density standard grid spacing of test probes on the grid base.

A further advantage of the invention is that the receiver plate and translator plate can be mounted in a combination that universally accepts the same translator fixture which can have various arrangements of translator pin configurations. The translator fixture and the connections from the fixture and from the translator module to the grid base need not be modified for each different board being tested.

In another embodiment of the invention, a uniform pressure transmitting system maintains uniform pressure on the board under test and on the translator module when compliant pressure is applied to the entire test assembly during testing. The pressure transmitting system includes a rigid frame mounted around the peripheries of the translator fixture and the translator module to spread the forces applied during testing to prevent undue bending forces being applied to the board under test or to the translator module.

These and other aspects of the invention will be more fully understood by referring to the following detailed description and the accompanying drawings.

DETAILED DESCRIPTION

Figure 1:
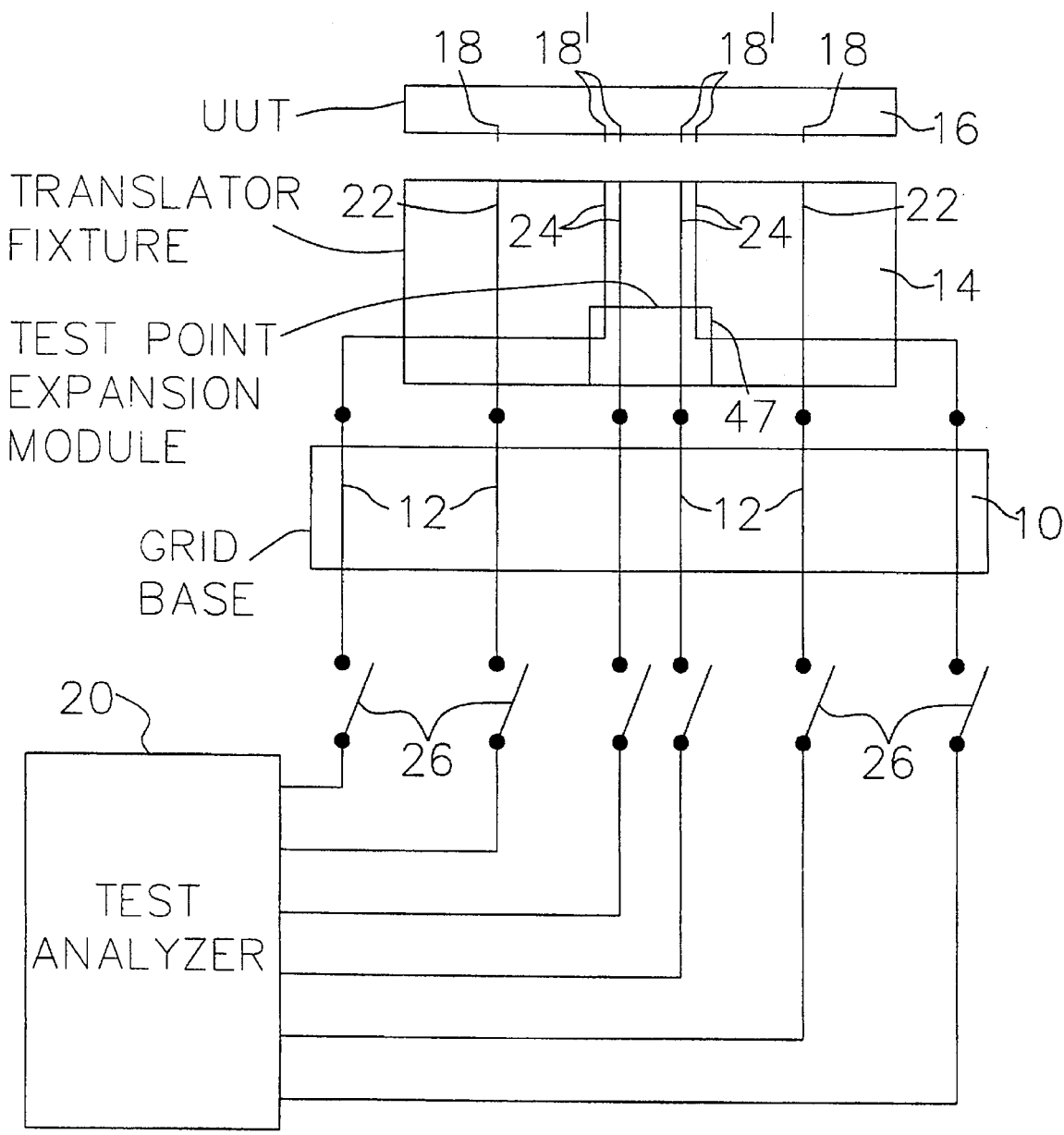
FIG. 1 is a schematic block diagram illustrating components of a translator fixture and a high density test point expansion module for expanding test points according to principles of this invention.

Referring to the schematic block diagram of FIG. 1, a grid-type printed circuit board tester includes a grid base 10 having an array of spring-loaded test probes 12 arranged on a two-dimensional grid pattern. The uniform array of probes preferably comprises an orthogonal array of uniformly spaced-apart rows and columns of test probes which may be aligned on 100 mil centers as an example. A translator fixture 14 supports a printed circuit board 16 under test. The translator fixture serves as an interface between an array of test points 18 and 18' on the board under test and the test probes 12 in the grid base 10. An external electronic test analyzer 20 is electrically connected to the test points in the board through test probes in the translator fixture. These test probes (of which there are several types) are illustrated generally at 22 and 24 in FIG. 1 and will be described in more detail below.

The test analyzer 20 contains electronic interrogation circuits to electronically interrogate the separate test points 18 and 18' of the board under test in order to determine whether or not an electrical connection exists between any two given test points. The electrical connections detected between test points on the tested board are electronically compared with stored reference results obtained from a previous interrogation of test points of a faultless master printed circuit board. The tested board is good if test results match the stored reference results, but if any problem exists in the circuits on the board, the problem is detected by the test results and the bad boards then can be separated from the good boards.

The electronic interrogation circuits, in one embodiment, comprise a plurality of printed circuit cards (sometimes called "switch cards") having electronic components and printed circuits for carrying out electronic testing. Each test probe used in the test procedure is represented as being coupled to the test electronics through a corresponding switch 26 leading to the test analyzer. In a given grid-type tester there can be as many as 40.000 switches available for testing the various test points in a board under test. However, as is typical with a grid-type fixture, many of these switches and the related electronic test circuitry goes unused when testing a given board, while only a selected percentage of test circuits having connections with the translator fixture 14 are actually used. As mentioned, the translator fixture provides the interface between the test points 18 and 18' being tested and the circuits within the electronic test analyzer 20 which are used to carry out the test.

The invention is useful for locally expanding the density of test points in regions within the fixture matching regions within the board under test where test point density exceeds the standard on-center density of grid base test probes 12. For instance, in a tester in which the array of grid base test probes has an on-center spacing of 100 mils, there may be regions within the board under test where spacing between test points 18' is between say 50 and 100 mils. (Test points 18 are represented as areas of the board where the density of test points generally does not exceed a level that can be normally reached by test probes connected to the standard grid base probes. Test points 18' represent areas of the board where test point density is much greater and cannot be reached by test probes connected to the standard grid base.) The high density spacings may be spread out in two dimensions across the board in a random pattern of closely spaced test points 18'. For these localized high density test point regions, the invention provides a means for fixturing high density patterns of test probes to translate test signals from the high density test points 18' on the board to the test circuits within the test analyzer 20. Many of the test circuits to which the test points 18' are connected by the translator fixture are test circuits which are otherwise unused by the normal grid pattern of test probes.

Figure 2:
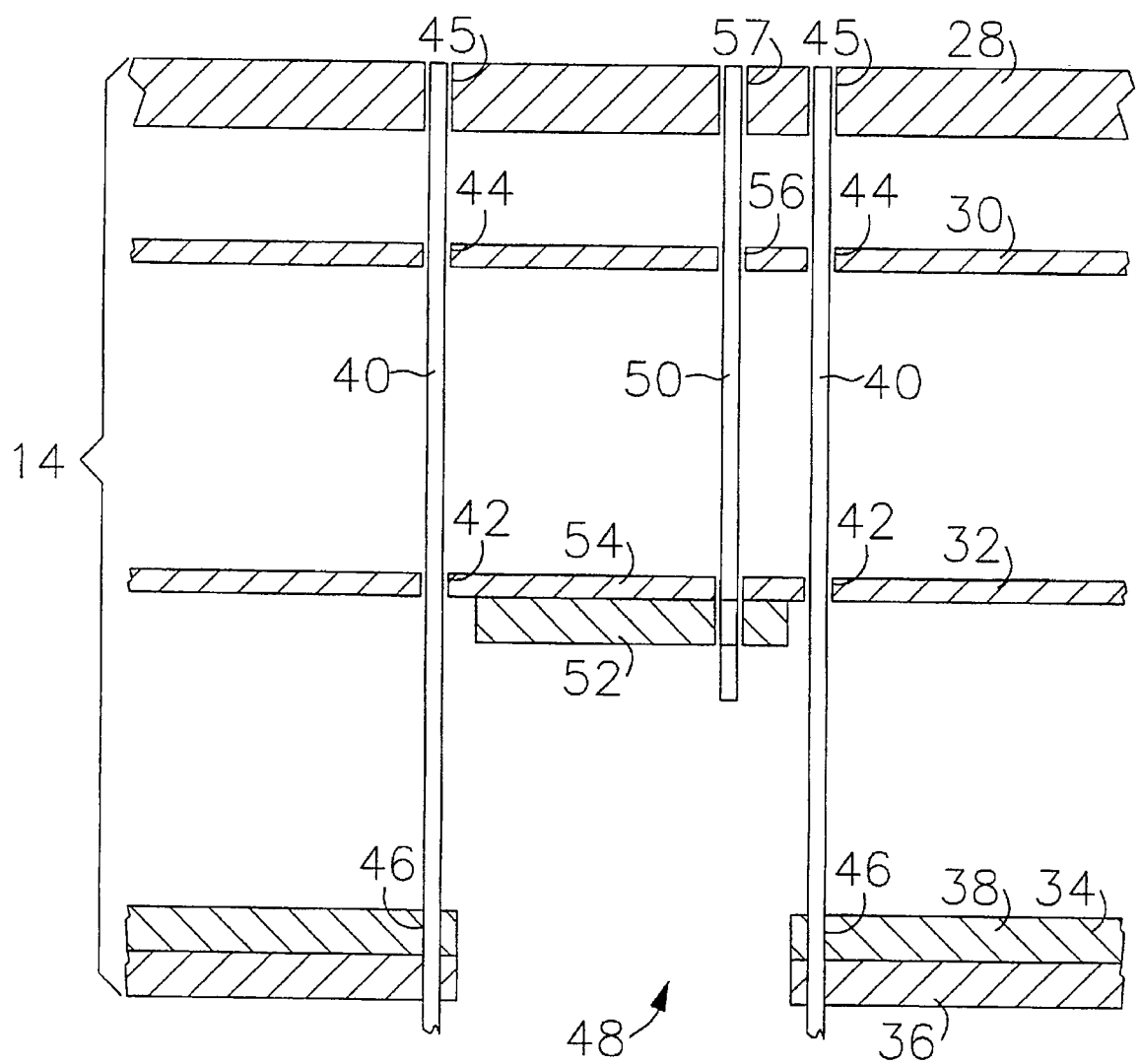
FIG. 2 is a semi-schematic cross-sectional view illustrating the translator fixture without the module.

The translator fixture 14 shown in FIG. 2 includes a series of vertically spaced-apart and parallel fixturing plates which include a top plate 28, an upper plate 30 spaced a short distance below the top plate, a lower plate 32 at approximately an intermediate level of the translator fixture, and a pair of base plates 34 and 36 which are part of a sandwich-type retainer assembly that also includes a pin retainer 38 sheet of flexible plastic sandwiched between the bottom plates 34 and 36.

The fixture includes an array of standard translator pins such as tilt pins 40 extending through the fixturing plates 28, 30 and 32 and through the base plate retainer assembly 34, 36, 38. FIG. 2 shows only a pair of standard tilt pins 40 for simplicity. The tilt pins extending through the base plate retainer assembly are in alignment with the grid pattern of probes 12 in the grid base 10. The top portions of the tilt pins, which extend through the top plate 28, are in an off-grid pattern aligned to match the random pattern of test points on the UUT. Thus, the tilt pins can be tilted slightly and various three dimensional orientations in order to translate between the grid pattern at the base to the off-grid pattern at the top. The standard tilt pins pass through holes 42 in the lower plate 32, through holes 44 in the upper plate 30, and through a hole pattern 45 in the top plate 28. The bottoms of the pins 40 are retained in holes 46 in the base plate retainer assembly. The plastic sheet 38 of the retainer assembly has undersized holes that grip the probes 40 to provide the retention. Standard computer operated software is used for controlling drilling of the hole patterns in the fixturing plates according to well-known procedures for aligning the tilt pins in the various orientations to translate from the grid pattern at the base to the off-grid pattern at the top.

For those regions of the UUT where test points 18' are in densities greater than the standard density of on-center spacing of the probes 12 in the grid base 10, the invention provides a high density test point expansion module 47

(described in greater detail below) for aligning tilt pins in the closer spacings necessary to match the high density patterns of test points 18' on the UUT. Each high density test point expansion module is mounted in a corresponding cutout space 48 formed in the base plate retainer assembly of the translator fixture. A plurality of such cutout spaces can be formed throughout the translator fixture for alignment with any corresponding pattern of high density test points in the UUT. Only one is shown in FIG. 2 for simplicity. The cutout spaces are preferably milled in the base plate retainer assembly in any desired pattern, but the embodiments shown in the drawings illustrate a rectangularly shaped cutout for receiving a module of similar rectangular shape. In those regions of the translator fixture where the cutout spaces 48 are formed to receive a test point expansion module 47, special tilt pins 50 are used for translating test signals between the UUT and connections within the translator module. As will be described in more detail below, the density of special tilt pins 50 greatly exceeds the normal density of standard tilt pins 40. Only one such special tilt pin 50 is shown in FIG. 2 for simplicity. In areas where the special tilt pins 50 are mounted above the cutout space 48 for the test point expansion module, a secondary retainer assembly 52 is attached to the lower plate 32 in a sandwich structure which also includes a plastic retainer sheet 54 between the retainer plate 52 and the lower plate 32. The retainer assembly 52, 54 retains the special tilt pins 50 in alignment with corresponding connections in the test point expansion module while the tilt pins 50 extend upwardly through a pattern of drilled holes 56 in the upper plate and through a corresponding pattern of drilled holes 57 in the top plate 28. The hole pattern 57 is in alignment with the high density pattern of test points 18' on the UUT 16. (The retainer assembly 52, 54 for the special tilt pins 50 is one of several possible arrangements; an alternative embodiment is shown in FIG. 3.)

Figure 3:
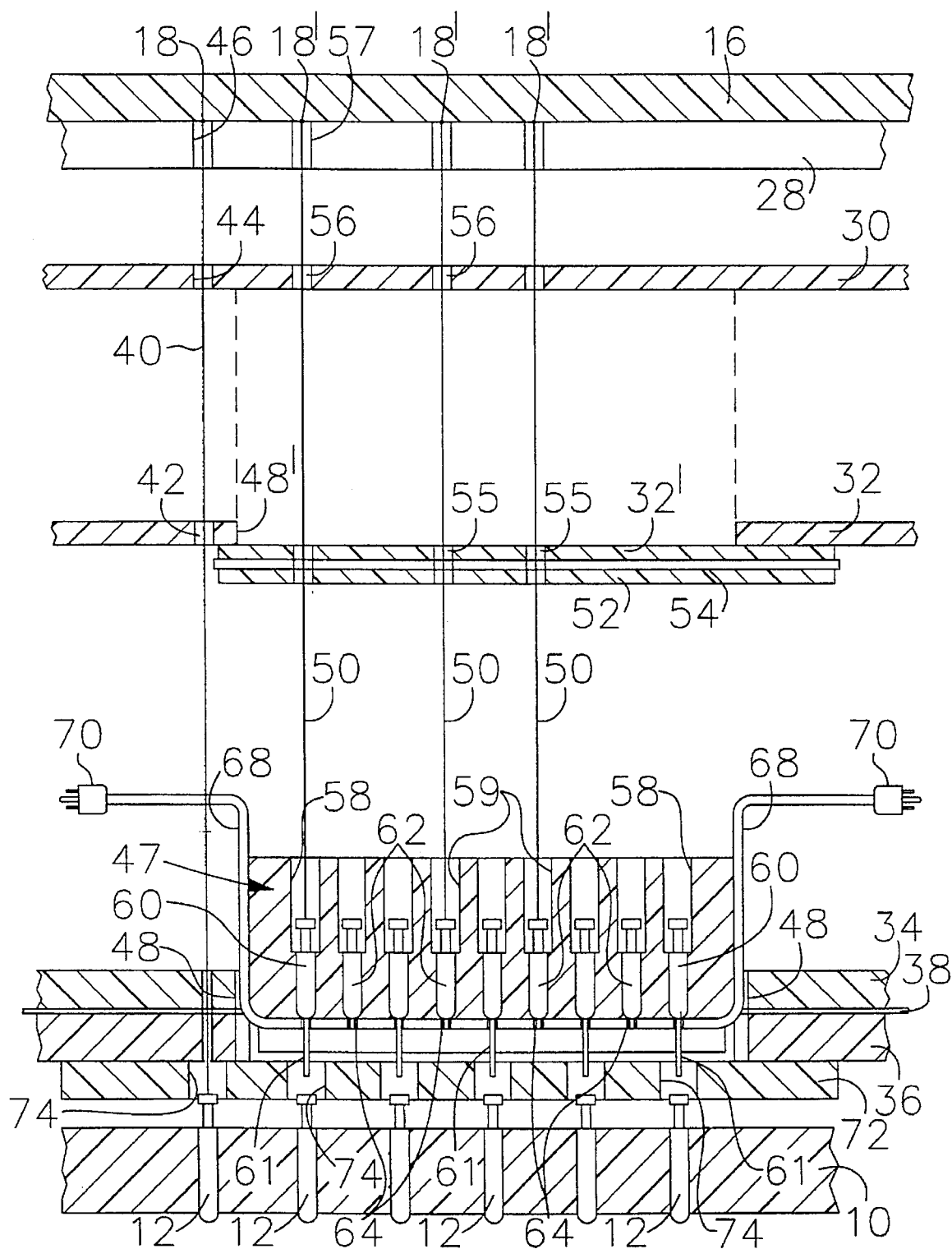
FIG. 3 is a semi-schematic cross-sectional view similar to FIG. 2 but showing the test module in use.

FIG. 3 is a schematic cross-sectional view showing the high density test point expansion module 47 positioned within the cutout space 48 in the base plate 34 of the fixturing assembly. The module comprises an electrically insulating housing with holes drilled through it in an array that combines a first two dimensional pattern of spaced-apart feed-through holes 58 matching the grid pattern of probes 12 in the standard grid base 10, together with an intervening second array of spaced-apart holes 59 in spaces between the first grid pattern of holes. The holes in each group mount corresponding electrical contacts such as spring probes for contact with the special tilt pins 50. The special tilt pins are retained in holes 55 in a secondary retainer assembly 32', 52, 54 attached below a cutout opening 48' in the lower fixturing plate 32. The cutout opening 48' provides for vertical positioning of the test point expansion module 47. The secondary intervening hole pattern 59 provides spaces within the module for mounting the additional spring probes 50 to accommodate the additional test points within the high density region of the test points 18' on the board under test. The cross-sectional view of FIG. 3 illustrates a row of holes drilled in the module housing which includes holes from both groups of hole patterns. The illustrated row of holes includes the spaced-apart holes 58 aligned with the grid pattern of spring probes 12 in the grid base 10 and the additional holes 59 located in the intervening spaces between adjacent pairs of standard grid pattern holes 58. Spring probes 60 are mounted in the standard grid pattern of holes 58 in the module with fixed pins 61 from the base of the probes 60 projecting from the bottom of the module housing. Thus, a two-dimensional grid pattern of pins 61 projects from the bottom of the housing for alignment with the corresponding grid pattern of probes 12 in the grid base 10. The array of additional holes 59 extending through the module housing support spring probes 62 which are seated in lower portions of the holes 59. These probes have short fixed pins 64 at their base which are soldered or otherwise electrically connected to corresponding circuit traces 66 (see FIG. 4) on a flexible sheet-like flex cable film 68 laminated to a lower portion of the module housing. End portions of the flex cable film extend outwardly from the module. The ends of the flex cables include plug-type connectors 70 for making electrical connections to electrical circuits within the external automatic circuit test analyzer 40. These circuits are coupled to corresponding switch cards within the test analyzer that are otherwise being unused by the fixturing connections to the test probes 12 of the standard grid probe plate.

When mounting the test point expansion module 47 within the cutout space 48 in the lower portion of the fixture, the module is aligned above and secured to a lower stripper plate 72 having an array of holes 74 matching the grid pattern of probes 12 in the grid base.

Figure 4:
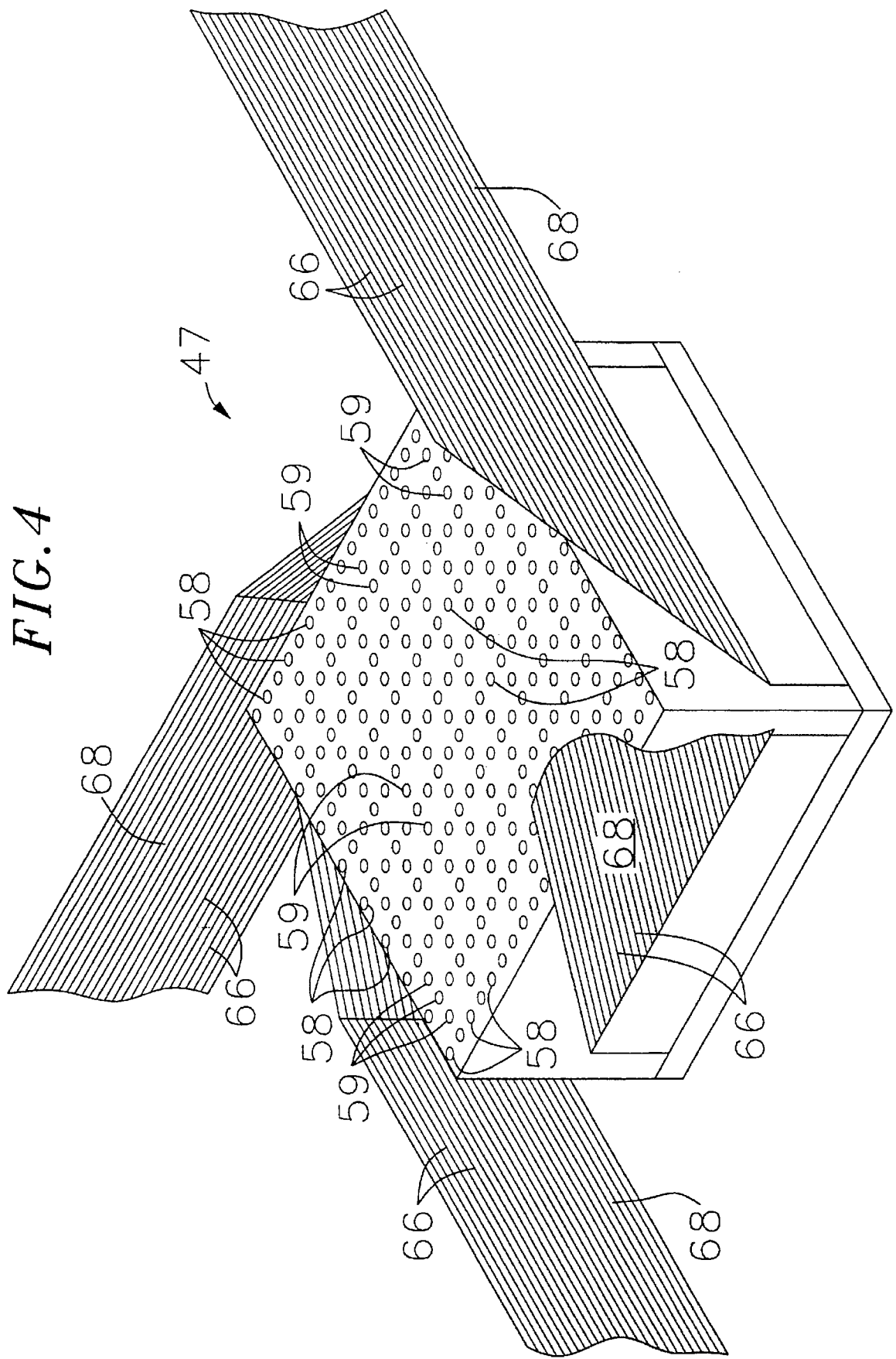
FIG. 4 is a semi-schematic perspective view illustrating the test module and flex cables.
Figure 5:
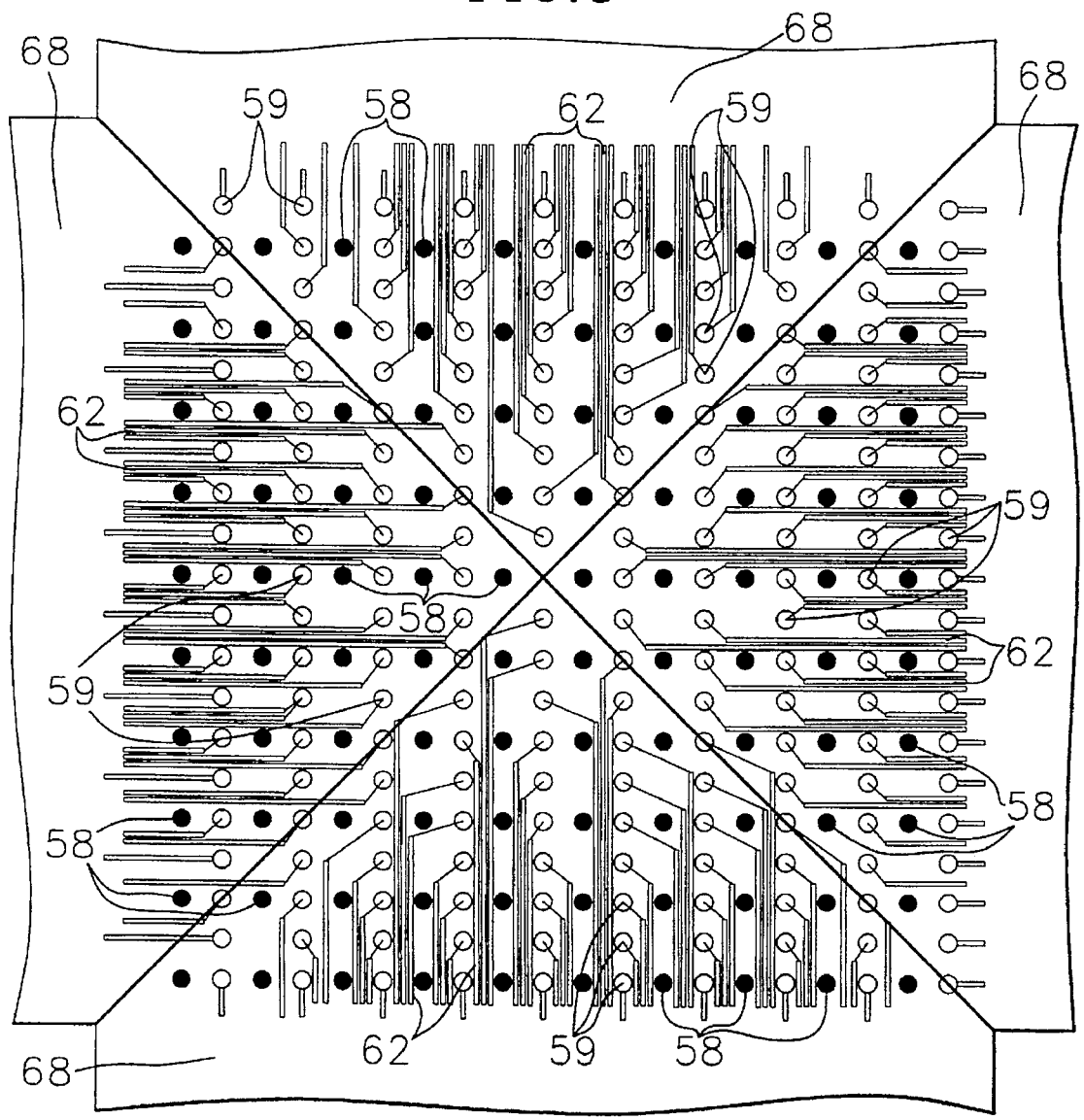
FIG. 5 is a schematic plan view illustrating a configuration of feed-through holes and additional electrical connections to circuits printed on a flex cable sheet contained in the expansion module.

FIG. 4 illustrates one embodiment of the module housing in which there are four flex cables 68 extending from the four sides of the module for conducting test signals from the high density probes 62 to the external circuit tester. As shown in FIG. 5, each flex circuit cable can terminate in an angled quadrant of the module housing and then extend to the exterior from each of the four sides of the housing. Alternatively, the flex cables can be limited to extending from only two sides of the module, say from opposite sides, by joining together two of the flex cables on each side of the module. In the latter case, the two joined cables attach to the module at different levels for connection to the pins 64.

FIG. 5 illustrates a typical arrangement of printed circuits on the flex cable that are aligned with and in communication with the sets of grid pattern holes and their probes, together with the high density set of holes and their corresponding probes. As illustrated in FIG. 4, the on-grid pattern of probes 60 provide feed-through connections at the level of the flex circuit within the housing; the intervening high density probes 62 are each connected to corresponding printed circuits on the flex circuit film for extending test signals to the external test analyzer away from and independently of the grid base probes 12. The probes 60 extend through the flex circuit film within the module without making electrical contact with the circuits on the flexible plastic film.

In use, the test expansion module 47 is plugged into the pre-drilled hole 48 within the base of the translator fixture 14 in regions of high density test probing, and the external flex circuit cable connectors 68 that extend away from each module are preferably twisted 90 degrees so that they can be fed through the field of tilt pins for extending to the exterior of the fixture for connection to the test analyzer. The ends of the flex cables have corresponding connectors that releasably engage the spring probes in the grid base around the periphery of the translator fixture. The short special translator pins or tilt pins 50 are used for connection to both sets of feed-through test probes 60 and high density expansion probes 62 within the module.

Figure 6:
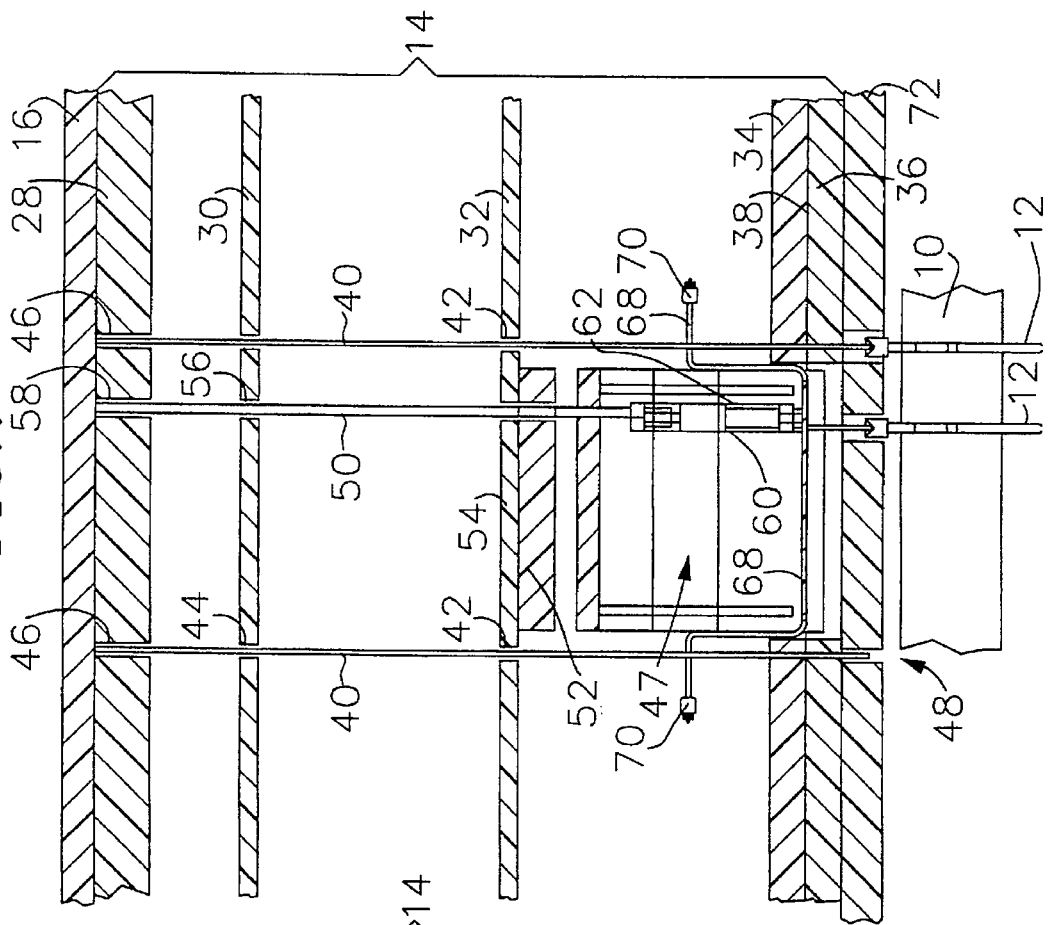
FIGS. 6 and 7 are similar semi-schematic cross-sectional views illustrating the test module in use during an uncompressed and compressed state, respectively.
Figure 7:
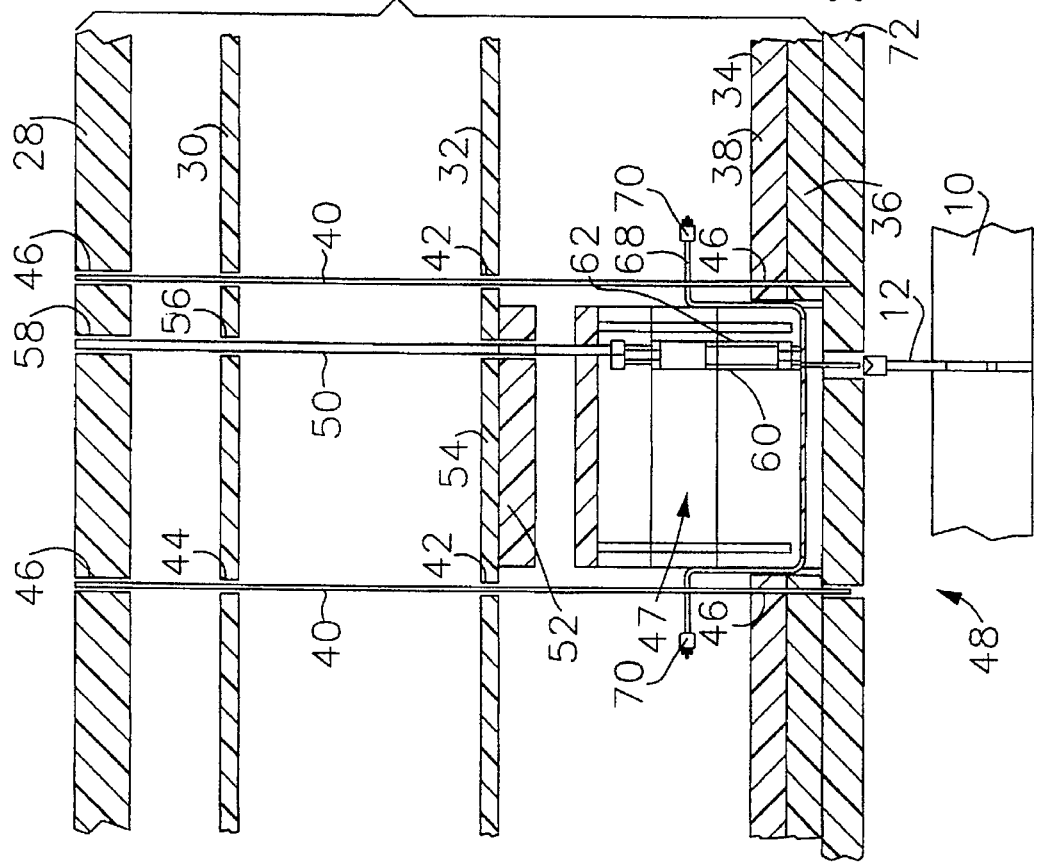

FIGS. 6 and 7 illustrate the translator module positioned within the translator fixture in which the test system shown in FIG. 6 is in an uncompressed state, and the system of FIG. 7 is shown in its compressed state with the translator fixture having moved down toward the grid base.

Thus, the invention provides a means for expanding the density of multiple test points in an area or areas within a translator fixture without adding external electronics to the fixturing system in order to test high density regions of the board under test. As a result, the same high speed electronic test analyzer can be used with the same standard grid base, with the test points in the high density regions being tied to areas within the test analyzer which are not otherwise being used. As a result, printed circuit boards having extremely small spacing distances for smaller and smaller sizes of integrated circuits and the like can be tested on the otherwise standard grid-type test fixtures.

FIGS. 8 through 13 illustrate an alternative embodiment of the invention which is useful for testing bare boards with high density random patterns of test points, in which the board is tested on a grid-type tester having a grid base with a standard on-center spacing of test probes, and in which the spacing among test points on the board under test is much greater than the spacing between spring probes in the grid base. The invention is particularly useful in testing small credit card sized circuit boards having high density patterns of test points. For instance, the board under test can have test points spaced apart by less than 50 mils whereas the on-center spacing between test probes in the standard grid base can be 100 mils. This arrangement can require tilt pins in the translator fixture to reach too far in making contact between the dense pattern of test points and the probes in the standard grid base. Use of tilt pins in this instance also can produce errors in the test results.

In the past, one approach to avoiding this problem when testing these boards on a grid fixture is to divide the tests into two phases: one for testing power and ground connections, and the other for functional testing. However, this requires configuring the translator fixture and its tilt pins twice, once for each test.

The present invention overcomes these problems by providing a translator module that can be used with the standard translator fixture and the standard grid base, to translate high density patterns of test points in multiple small circuit boards tested simultaneously in a single test. As a result, the loss of time in reconfiguring the translator fixture is avoided and testing is also sped up because multiple circuit boards can be tested at once. Further, the invention has the advantage that the translator module can be used interchangeably with different translator fixtures adapted for testing different circuit boards without making modifications to the system software, inasmuch as the same test probes on the grid base can be used for each different test fixture.

These advantages will be more fully apparent by referring to the following description as it relates to the embodiment of FIGS. 8 through 13.

Figure 8:
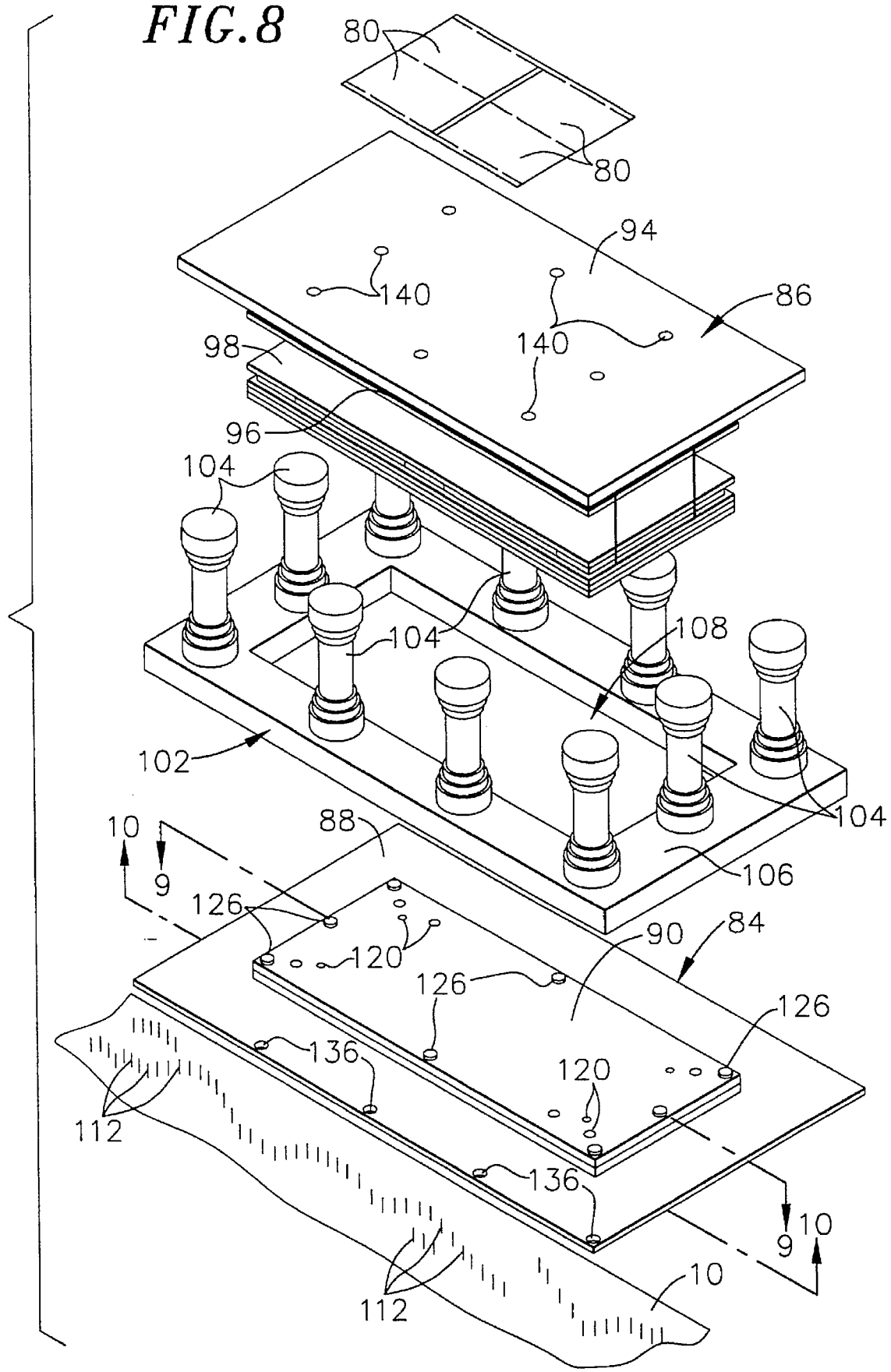
FIG. 8 is an exploded perspective view showing components of an alternative form of the invention comprising a translator module and a force absorbing outer frame for use in simultaneously testing multiple circuit boards each having test points in patterns of higher density than the grid pattern of test probes on a standard grid base.
Figure 11:
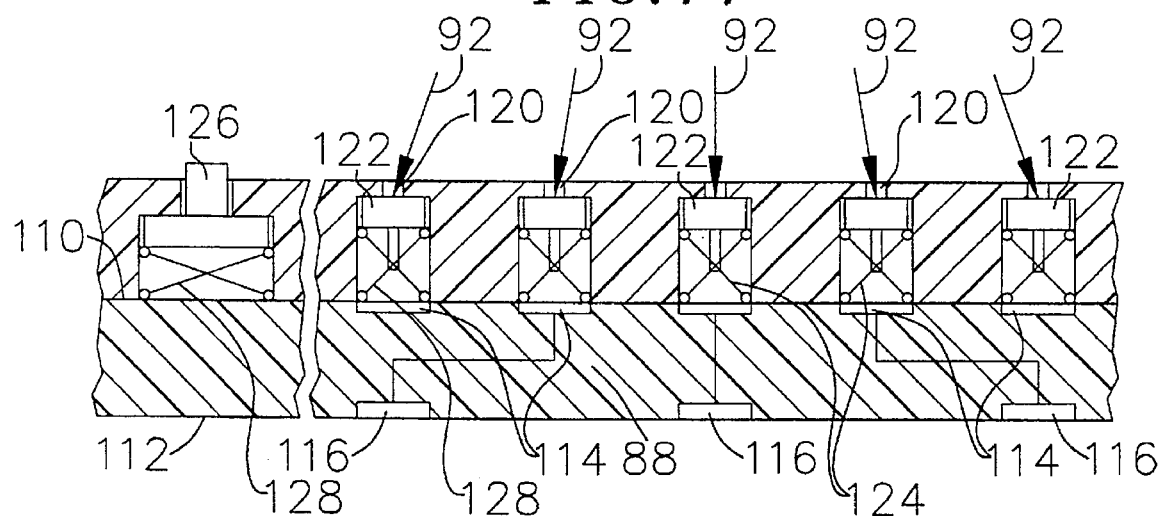
FIG. 11 is a fragmentary schematic cross-sectional view illustrating components of a translator module according to the alternative embodiment of the invention.
Figure 12:
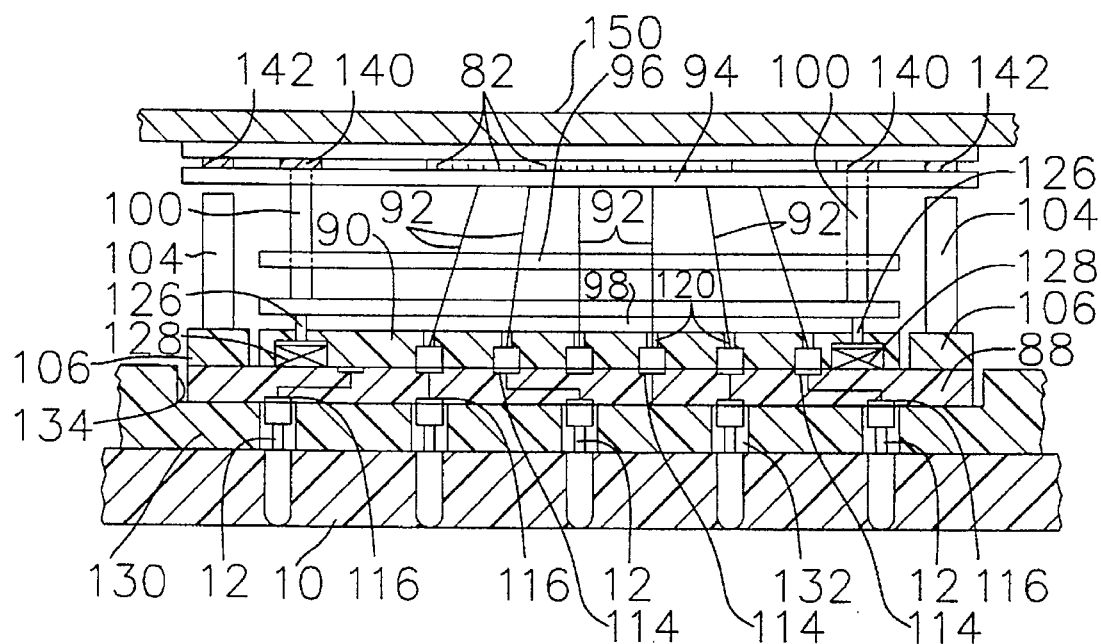
FIG. 12 is a schematic cross-sectional view showing the translator module of FIG. 11 in use between a translator fixture and a standard grid base.

The exploded perspective view of FIG. 8 illustrates components of the system for simultaneously testing a plurality of small credit card sized circuit boards 80 having high density patterns of test points 82 (shown best in FIG. 12). The assembly includes a translator module 84 positioned between the grid base 10 and a translator fixture 86. The translator module includes a translator board 88 that rests on the grid base and a test pin receiver plate 90 supported on top of the translator board and adapted to receive the bottoms of tilt pins (see FIGS. 11 and 12) contained in the translator fixture. The translator fixture includes a plurality of vertically spaced-apart, horizontally positioned and parallel translator plates with holes drilled in a hole pattern that supports the tilt pins in a manner similar to that described for the embodiment of FIGS. 1 to 7. In the present embodiment the translator fixture includes a rectangular top plate 94 of enlarged surface area compared to the other translator plates in the fixture. The fixture also includes an upper translator plate 96 and a lower translator plate 98. The translator plates are best shown in FIG. 12 which also shows vertical stand off posts 100 spaced apart around the periphery of the fixture for securing the translator plates of the fixture together as a rigid unit.

The assembly of FIG. 8 also includes a rigid pressure-absorbing outer frame 102 having upright column-like pressure feet 104 supported on and spaced apart around the periphery of a rectangular peripheral plate 106. A rectangular cutout 108 centrally disposed in the rectangular peripheral plate 106 matches the shape of the rectangular pin receiving plate 90 of the translator module which extends into the space within the cutout during assembly.

Figure 9:
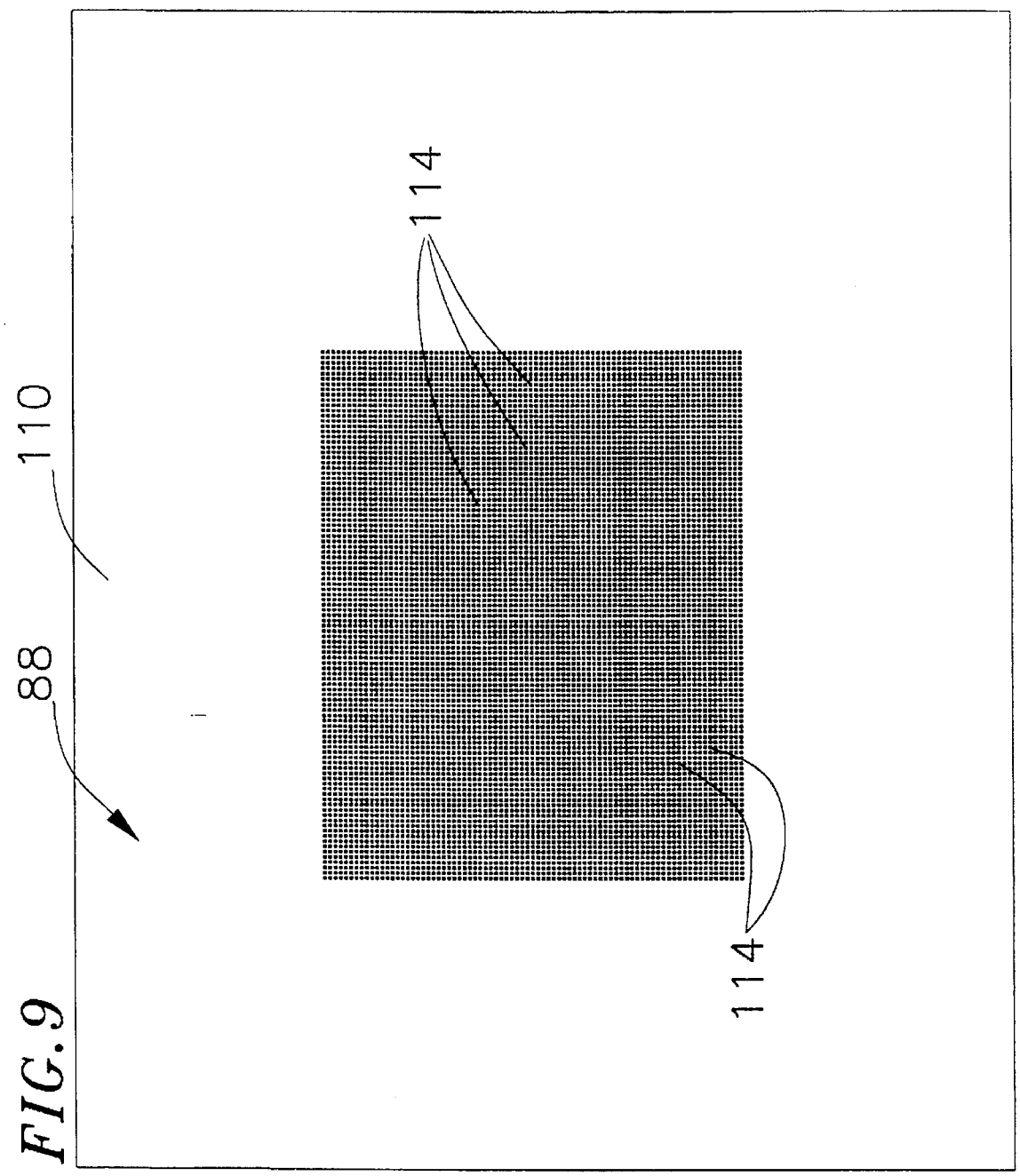
FIG. 9 is a top elevational view taken on line 9—9 of FIG. 8.
Figure 10:
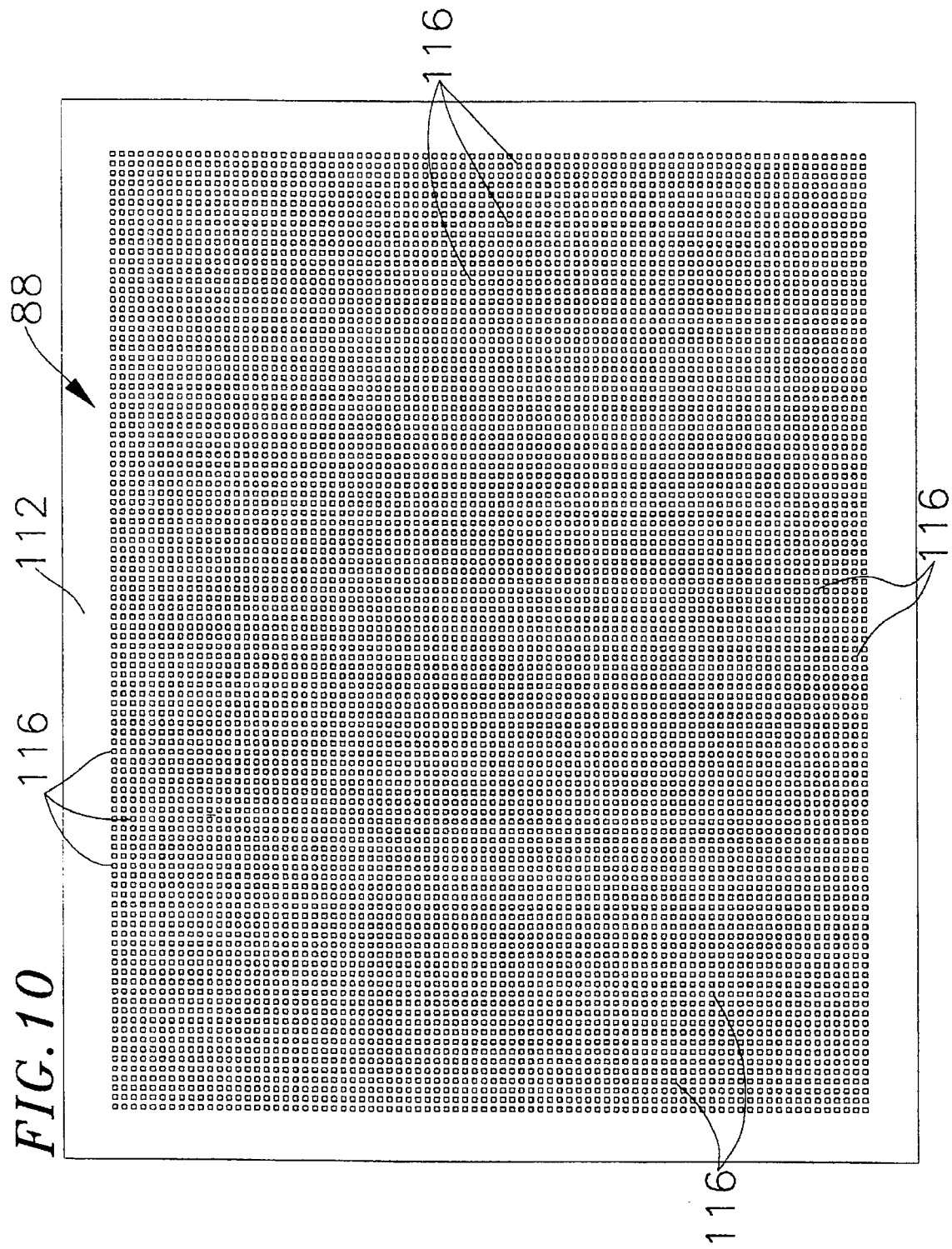
FIG. 10 is a bottom elevational view taken on line 10—10 of FIG. 8.

FIGS. 9 through 11 illustrate detailed construction of the translator board 88. The board includes a multilayer circuit board made from an electrically insulating material and having parallel first and second surfaces 110 and 112. A first array of electrically conductive pads 114 faces upwardly from the first surface of the board, and a second array of electrically conductive pads 116 faces down from the second surface of the board. The first array of test pads are spaced closer together in rows and columns to form a high density array of pads facing upwardly from the board. The second array of pads are spread apart in rows and columns of wider spacing than the pads on the other side of the board. The same number of pads are used on both sides of the board, and each pad on one side is electrically connected internally to a corresponding pad on the other side. The internal connections are translated between pads in the same locations in the arrays on both sides so that electrical contact with a given pad on one side can be easily identified with a corresponding pad at the same location in the array on the opposite side. In one embodiment, the translator board has eight thousand pads on each side and the spacing between pads 114 on the first side of the board is 5 mils and the spacing between the pads 116 on the second side of the board is 10 mils, both being in uniform grid patterns (parallel rows and columns uniformly spaced apart by the same distance).

The 10 mil spacing between the test pads 116 on the second side of the translator board is adapted for alignment with a corresponding 10 mil spacing of the grid pattern of spring-loaded test probes 12 in the grid base 10, as shown best in FIG. 12. The 10 mil spacing is described as one embodiment. If a grid base of a grid-type fixture contains spring probes arranged on a grid pattern having a different spacing, the spacing among test pads 116 on the bottom of the translator boar is arranged accordingly in order to match the pattern of spring probes in the grid base.

Figure 13:
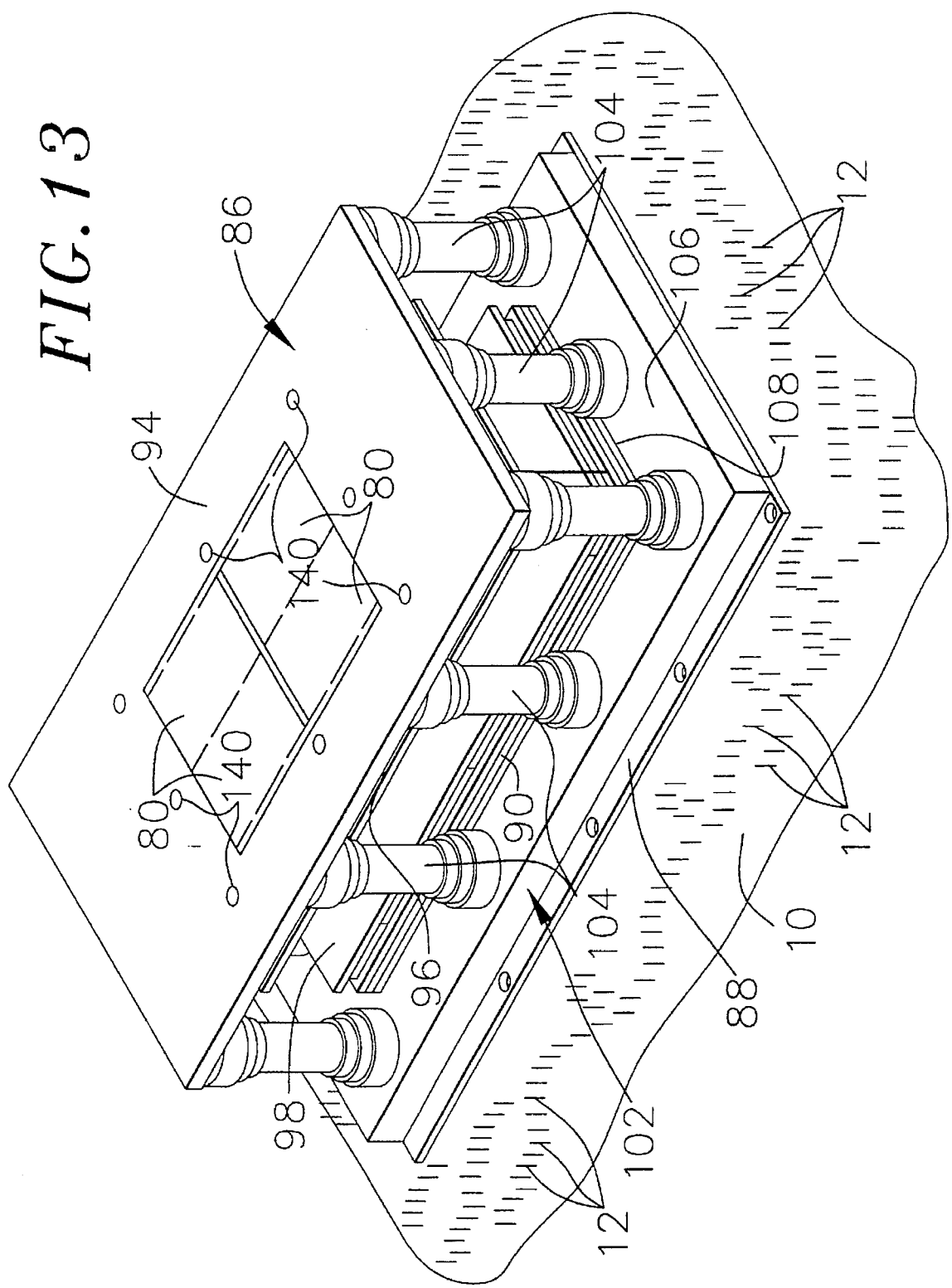
FIG. 13 is a perspective view showing the components of FIG. 8 during use.

Referring to FIG. 11, the translator module 84 also includes the translator pin receiving plate 90, which may also be referred to as a cassette. Although the pin receiving plate is shown in FIGS. 8 and 13 as a two layer board, the board is also shown as a single layer board for simplicity in FIGS. 11 and 12. The receiving plate includes a rigid plate made from an electrically insulating material and having an array of compliant electrical translator means within the plate arranged on a pattern corresponding to the pattern of test pads 114 on the first surface o the translator board to which the plate is mounted. In the illustrated embodiment, the compliant translator means comprise separate translator pin receiver holes 118 arranged in an array on a top face 120 of the receiver plate. The pin receiver holes are adapted to receive and retain the bottom end portions of the translator pins 100 carried by the translator fixture. The lower portions of the receiving holes are enlarged to contain separate spring biased electrical contacts 122 which are movable within the receiver plate and biased by corresponding compression springs 124. When the receiver holes and their corresponding compliant spring contacts 122 are aligned with the test pads 114 on the translator board, electrical contact is completed from the bottoms of the tilt pins 92, through the spring contacts 122, through the conductive springs 124, to the test pads 114 on the translator board.

The pin receiving plate also includes a plurality of spring-biased non-conductive pressure-distributing buttons 126 spaced apart around the periphery of the plate. The buttons are spring-biased to normally project above the upper surface of the plate by separate captive compression springs 128.

FIG. 12 illustrates use of the translator system in which an electrically conductive stripper plate 130 is first positioned over the spring probes 12 of the grid base 10. The spring probes 10 project into corresponding transfer holes 132 drilled on a corresponding grid pattern in the stripper plate. To accommodate vertical travel during use, the stripper plate can include a rectangular recessed region 134 for receiving the translator module to align the spring probes for contact with the pads at the bottom of the translator board. Tooling pins in tooling pin holes 136 of the translator board provide the alignment. When the translator module is aligned in the stripper plate, the contact between the spring probes of the grid base is translated through the aligned test pads 116 internally through the translator board to the test pads 114 on top of the board. These test pads communicate with the spring contacts 122 in the translator pin receiver holes 120 of the receiver plate 90. When the translator fixture is positioned above the translator module, the fixture rests on the spring-biased bottoms 126 to initially align the fixture parallel to the translator module and the grid base. The buttons initially support the fixture spaced parallel above the translator module. The bottoms of the tilt pins 92 are aligned with corresponding receiver holes 120 in the receiver plate 90. The translator fixture is positioned above the top surface of the translator pin receiver plate so the tilt pins supported by the translator fixture can move into the corresponding pin receiver holes 120 when a downward compression force is applied during testing. The circuit board under test 80 is positioned on top of the translator fixture and the tilt pins 92 being positioned to correspond to the pattern of test points on the underside of the board 80 provides electrical test signal communication from the underside of the board to the spring contacts 122 in the translator pin receiver holes 120. Thus, a high density pattern of test points 82 on the board under test is translated to a high density pattern of spring contacts contained within the upper portion of the translator module, the difference being that the tilt pins translate the high density random off-grid pattern of test points to an on-grid pattern. The translator fixture is positioned so that the stand-off posts 100 of the fixture are aligned vertically and positioned on top of the spring-loaded buttons 126 that are spaced apart around the periphery of the translator pin receiving plate 90. Thus, each spring-loaded button 126 is aligned With a corresponding post 100 of the translator fixture. In addition, spacers 140 are positioned around the periphery of the top plate 94 of the translator fixture to surround the circuit board 80 under test. The spacers 140 have the same thickness as the circuit board 80 under test. These spacers are also aligned vertically with the posts 100 of the translator fixture and the pressure buttons 126 on the translator module.

The outer pressure distributing frame 102 is placed around the outside of the translator module and the translator fixture. As shown best in FIG. 12 the bottom of the peripheral frame 106 rests on the peripheral top face of the translator board 88 which surrounds the translator pin receiving plate 90. With the pressure distributing frame 102 arranged around the periphery of the translator module, the pressure distributing posts 104 are also spaced around the outside of the translator module with their top surfaces spaced a short distance of travel from the underside of the translator fixture's top plate 94 (as shown best in FIG. 12). The translator fixture further includes spacers 142 having a thickness the same as the board 80 under test arranged around the periphery of the top plate 94 of the test fixture.

During use, a force-applying platen 150 on the exterior of the tester applies a downward force to the translator fixture to compress the probes within the fixture to produce compliant mechanical and electrical contact necessary to produce reliable electrical connections from the board under test, through the tilt pins to the compliant contacts in the translator module, and through the translator board to the spring probes in the grid base. Pressing down on the top of the board under test can have a tendency to bend the periphery of the board so it bows upwardly, but the spacers 140 and 142 of the same thickness as the board under test prevent the board from bending. The downward compression forces are translated through the stand-off posts 100 in the translator fixture to compress the compliant buttons 126 at the periphery of the receiver plate on the translator module. The downward pressure then causes the bottoms of the tilt pins to move into the receiver holes and compress the spring-biased contacts 122 in the receiver plate as the bottom of the translator fixture moves onto the receiver plate. This downward force can have a tendency to cause the periphery of the translator board to bow upwardly, but the rigid pressure-absorbing frame 106 mounted around the top peripheral portion of the translator board resists bending of the board. The column-like force-absorbing feet 104 are spaced apart around the periphery and a downward force of the platen directed onto the columns spreads the force to compress the translator board uniformly.

What is claimed is:

1. In a grid-type test fixture for testing a printed circuit board in which the grid fixture includes a grid base supporting spring-loaded test probes arranged in a grid pattern having a standard on-center spacing, the probes in the grid base being individually connected to corresponding electrical test circuits in an external automatic electronic test analyzer, and a translator fixture mounted between the grid base and the board under test, in which the translator fixture has vertically spaced-apart and parallel fixturing plates with holes drilled on patterns to support individual generally upright translator pins separately inserted into the holes of the fixturing plates for translating electrical connections between an off-grid pattern of test points in the board under test to the grid pattern of corresponding spring probes in the grid base, the improvement comprising a high density translator module for connecting to one or more regions of the board under test where test point density exceeds the standard on-center spacing of the probes in the grid base, the high density translator module including a grid pattern of feed-through spring probes contacting a first set of said translator pins which make contact with to certain test points in the high density region on the board, the feed-through spring probes on the translator module making normal spring contact with the grid pattern of standard spring probes in the grid base, the high density test module also including a second set of spring probes located between the rows and columns of feed-through probes, the second set of spring probes supporting a corresponding second set of translator pins for making contact with test points in the high density region of the board, the second set of translator pins separately inserted into the holes of the fixturing plates of the translator module, the second set of spring probes making contact with electrical test circuits within an electrical terminal means connected to and extending from the high density translator module to a peripheral region of the grid base for coupling to test circuit electronics in the electronic test analyzer without the need for increasing the test circuits in the test analyzer.

2. Apparatus according to claim 1 in which the terminal means comprise electrical test circuits printed on a plurality of flex cables secured to the high density translator module and extending to its periphery for coupling to the grid base.

3. Apparatus according to claim 2 in which the density of test paints within the translator module is at least doubled with respect to the standard density of test points in the grid base.

4. Apparatus according to claim 3 in which the density of test points within the translator module is at least tripled compared to the standard density of test points in the grid base.

5. A translator module for a grid-type test fixture having a grid base with test probes on a grid pattern coupled to an external automatic electronic test analyzer, the translator module comprising a housing having a bottom and a top spaced above the bottom of the housing and a surface area within the plane of the grid base substantially smaller than the area occupied by the grid pattern of test probes within the grid base, the translator module including a first set of feed-through holes containing a first set of test probes with pins projecting from the bottom of the housing in a grid pattern matching the grid pattern of test probes on the grid base, and a second set of high density holes in spaces within the bottom of the housing intervening between the first set of feed-through holes, the second set of high density holes containing a second set of test probes electrically connected to corresponding circuit traces in an electrically insulating sheet contained within the bottom of the housing and projecting away from the exterior of the housing for connection to test circuits within the test analyzer, the first and second sets of holes opening through the top of the module housing and adapted for receiving corresponding translator pins inserted into the first and second sets of holes for contact with the first and second test probes disposed therein, the translator pins used to provide an interface between the translator module and a high density region of test points within a printed circuit board under test.

6. Apparatus according to claim 5 in which the electrically insulating sheet and its electrical circuits comprise a flexible plastic sheet with printed electrical circuits sandwiched within a level of the housing with the individual circuits electrically connected to corresponding test probes within the second set of probes.

* * * * *

UNITED STATES PATENT AND TRADEMARK OFFICE
CERTIFICATE OF CORRECTION

PATENT NO. : 5,633,598
DATED : May 27, 1997
INVENTOR(S) : David R. Loan; Mark A. Swart It is certified that error appears in the above-indentified patent and that said Letters Patent is hereby corrected as shown below:

Column 1, lines 8,9, change "Ser. No 08/200.783" to --Ser. No. 08/200,783--.
Column 8, line 48, after "test" insert --point--.
Column 10, line 49, change "boar" to --board--.
Column 10, line 60, replace "surface o" with --surface of--.
Column 11, line 57, replace "aligned With" with --aligned with--.
Column 12, line 60, change "a,first" to -- a first --.

Signed and Sealed this

Fifth Day of May, 1998

Attest:

BRUCE LEHMAN

*Attesting Officer*                *Commissioner of Patents and Trademarks*